United States Patent [19]

Daughton

[11] Patent Number: 4,918,655
[45] Date of Patent: Apr. 17, 1990

[54] MAGNETIC DEVICE INTEGRATED CIRCUIT INTERCONNECTION SYSTEM

[75] Inventor: James M. Daughton, Edina, Minn.

[73] Assignee: Honeywell Inc., Minneapolis, Minn.

[21] Appl. No.: 161,534

[22] Filed: Feb. 29, 1988

[51] Int. Cl.[4] .......................... G11C 5/06; G11C 11/15
[52] U.S. Cl. ...................................... 365/173; 365/66; 29/604; 427/128
[58] Field of Search ...................... 365/63, 66, 72, 158, 365/173; 427/128; 29/604

[56] References Cited

U.S. PATENT DOCUMENTS

| | | | |
|---|---|---|---|
| 3,701,931 | 10/1972 | Revitz et al. | 317/234 |
| 3,798,623 | 3/1974 | Kaske et al. | 365/173 |
| 3,908,194 | 9/1975 | Romankiw | 360/113 |
| 4,024,489 | 5/1977 | Bajorek et al. | 338/32 |
| 4,100,609 | 7/1978 | Schwee et al. | 365/87 |
| 4,231,107 | 10/1980 | Schwee et al. | 365/87 |
| 4,356,523 | 10/1982 | Yeh | 360/113 |
| 4,470,873 | 9/1984 | Nakamura | 156/640 |
| 4,499,515 | 2/1985 | Piotrowski et al. | 360/113 |
| 4,503,394 | 3/1985 | Kawakami et al. | 324/252 |
| 4,520,413 | 5/1985 | Piotrowski et al. | 360/113 |
| 4,731,757 | 3/1988 | Daughton et al. | 365/173 |
| 4,754,431 | 6/1988 | Jenson | 365/158 |
| 4,780,848 | 10/1988 | Daughton et al. | 365/173 |

FOREIGN PATENT DOCUMENTS

| | | | |
|---|---|---|---|
| 53-33399 | 3/1978 | Japan | 365/8 |
| 55-123183 | 9/1980 | Japan | 365/8 |
| 763964 | 9/1980 | U.S.S.R. | 365/8 |

Primary Examiner—James W. Moffitt
Attorney, Agent, or Firm—W. T. Udseth

[57] ABSTRACT

A component metallization interconnection system in a monolithic integrated circuit system for providing electrical interconnections between circuit components and for providing magnetic interaction regions for information storage.

34 Claims, 3 Drawing Sheets

MAGNETIC DEVICE INTEGRATED CIRCUIT INTERCONNECTION SYSTEM

Reference is hereby made to earlier filed copending applications by J. M. Daughton and J. S. T. Huang entitled "Magnetic Memory Configuration" having Ser. No. 879,679, now U.S. Pat. No. 4,731,757 by J. A. Schuetz entitled "Resistive Overlayer for Magnetic Films" having Ser. No. 939,315, now U.S. Pat. No. 4,857,418 and by M. L. Jenson entitled "Vialess Shorting Bars for Magnetoresistive Devices" having Ser. No. 008,211 now U.S. Pat. No. 4,754,431. These copending applications have been assigned to the same assignee as the present application.

BACKGROUND OF THE INVENTION

This invention relates to magnetic device structures in monolithic integrated circuits and, more particularly, to the interconnection of such magnetic device structures and other portions of the integrated circuit.

Digital memories for digital systems of various kinds can be advantageously based on the storage of digital bits as alternative states of magnetization in ferromagnetic thin film materials used to provide each memory storage cell. Access to the information stored in such memory cells can be provided by using magnetoresistive sensing to determine the magnetization state in the material. Such ferromagnetic thin film memories can be provided on the surface of a monolithic integrated circuit to permit convenient electrical interconnections between the memory cell containing such ferromagnetic thin film material, and the memory operating circuitry.

Ferromagnetic thin film memory cells are usually made very small and packed very closely together to achieve a significant density of stored bits, particularly when provided on a surface in a monolithic integrated circuit. The magnetic environment thereabout can become quite complex with fields in any one memory cell affecting the film portions in neighboring memory cells. Also, small ferromagnetic film portions in a memory cell can lead to substantial demagnetizing fields which can cause instabilities in the magnetization state desired in such a cell in the storage of information therein.

These magnetic effects between neighbors in an array of closely packed ferromagnetic thin film memory cells can be ameliorated to a considerable extent by providing a memory cell based on an intermediate separating material having two major surfaces on each of which a magnetoresistive, anisotropic ferromagnetic memory film is provided. Such an arrangement provides significant "flux closure" to thereby confine the magnetic fields arising in a cell to affecting primarily just that cell. This is considerably enhanced by choosing the separating material in the ferromagnetic memory film to be sufficiently thin.

Often such a digital memory is constructed by having a number of memory cell storage structures (or bit structures if there is a single structure per bit), at which magnetic interactions occur in storing or obtaining information therein, connected in series at junctures to one another in an end-to-end fashion. A series of current straps, or word lines, are often provided in an orthogonal layout to the series of connected storage structures so that a strap crosses each of the structures between the junctures therein. In a magnetoresistive memory, such straps or word lines are used both in the entering of and the sensing of information in the bit structures. This can be done by using currents in the word lines for setting, or for determining the existing, magnetization state of storage structures in the memory.

However, with respect to magnetic fields generated by word lines over a storage structure there is no "flux closure." This is because the word line is over the top of the bit structure so that there is no closed magnetic path or magnetic fields in the structure around the word line. The result is that very large demagnetizing fields can occur in the bit structure both for entering information and for sensing information in that structure. Such fields can seriously disrupt operation of the memory.

These demagnetizing fields can be reduced by properly constructing such bit structures, providing a narrowing geometry or taper toward the ends of the structures where they come to the junctures. A narrowed portion of magnetic material may extend entirely through a juncture between storage structures.

With such magnetic structure arrangements, the resultant magnetization of bit or storage structures becomes more stable giving better defined alternative magnetization states for storing digital information. In those memory cell structures from which such information is to be extracted by use of the magnetoresistive properties to assess which of these magnetization states occurs in the ferromagnetic memory films, some sort of sensing current is applied through the storage structures in addition to that supplied through the word lines.

Storage structures formed as bit structures, each being in one of two alternate magnetization states typified by having the magnetization vector point in one of two approximately opposite directions more or less along the easy axis, will have correspondingly different resistances at least during a reading operation depending on which magnetization state such structure is in. A sense current provided through the structure will then lead to different voltage drops across the structure depending on its magnetization state thereby providing the information as to the state it is in. Alternatively, a sensing voltage could be applied to such bit structures with the resulting current differences, because of their resistance differences, indicating which magnetization state is present in a bit structure.

The signal information contained in either of these differing voltage drops, or these differing current flows, must be sensed and then provided to other portions of the circuitry for transmitting and using this information. Such sensing, transmitting and using is accomplished in circuitry provided in the monolithic integrated circuit outside of, and supporting, the memory cell array. Thus, connections must be made to the series of connected bit structures, or storage structures, located in the monolithic integrated circuit outside of the array. Heretofore, this has been done through the provision of a metallization interconnection system that is placed in contact with the series connected bit structure arrangement through an opening in an overlying protective layer, this metallization interconnection then being extended over the protective layer to another opening therein. There it is placed in contact with a circuit component in the circuitry outside the array. The provision of such a metallization interconnection requires additional processing steps after provision of the bit structures. These processing steps require certain tolerances to provide reliable results which lead to the metallization interconnection taking additional space to provide sufficient tolerances to assure that electrical contact is made to the bit structures.

Thus, an interconnection arrangement which can reduce the number of processing steps required is desirable to reduce costs and improve reliability. Further, an arrangement which minimizes the space required for interconnections between the memory cell array and circuitry external thereto will also reduce cost through increasing the density of circuitry per unit area in the monolithic integrated circuit.

SUMMARY OF THE INVENTION

The present invention provides a composite metallization interconnection system in a monolithic integrated circuit for providing electrical interconnections between circuit components and for providing magnetic interaction regions capable of having a current established therethrough so as to result in a magnetoresistive response therein. The composite metallization comprises a magnetic structure and a conductive structure. The magnetic structure is formed of an intermediate layer with a magnetoresistive, anisotropic ferromagnetic thin film on either side thereof together supported on the integrated circuit. This magnetic structure supports the conductive structure having a conductive layer therein except at such magnetic interaction regions. Such an arrangement is attained by providing a magnetic structure on the monolithic integrated circuit, and then providing the conductive structure, including a conductive layer, over the magnetic structure which layer has portions thereof removed at the magnetic interaction regions.

DETAILED DESCRIPTION OF THE PREFERRED EMBODIMENTS

Figure 1:
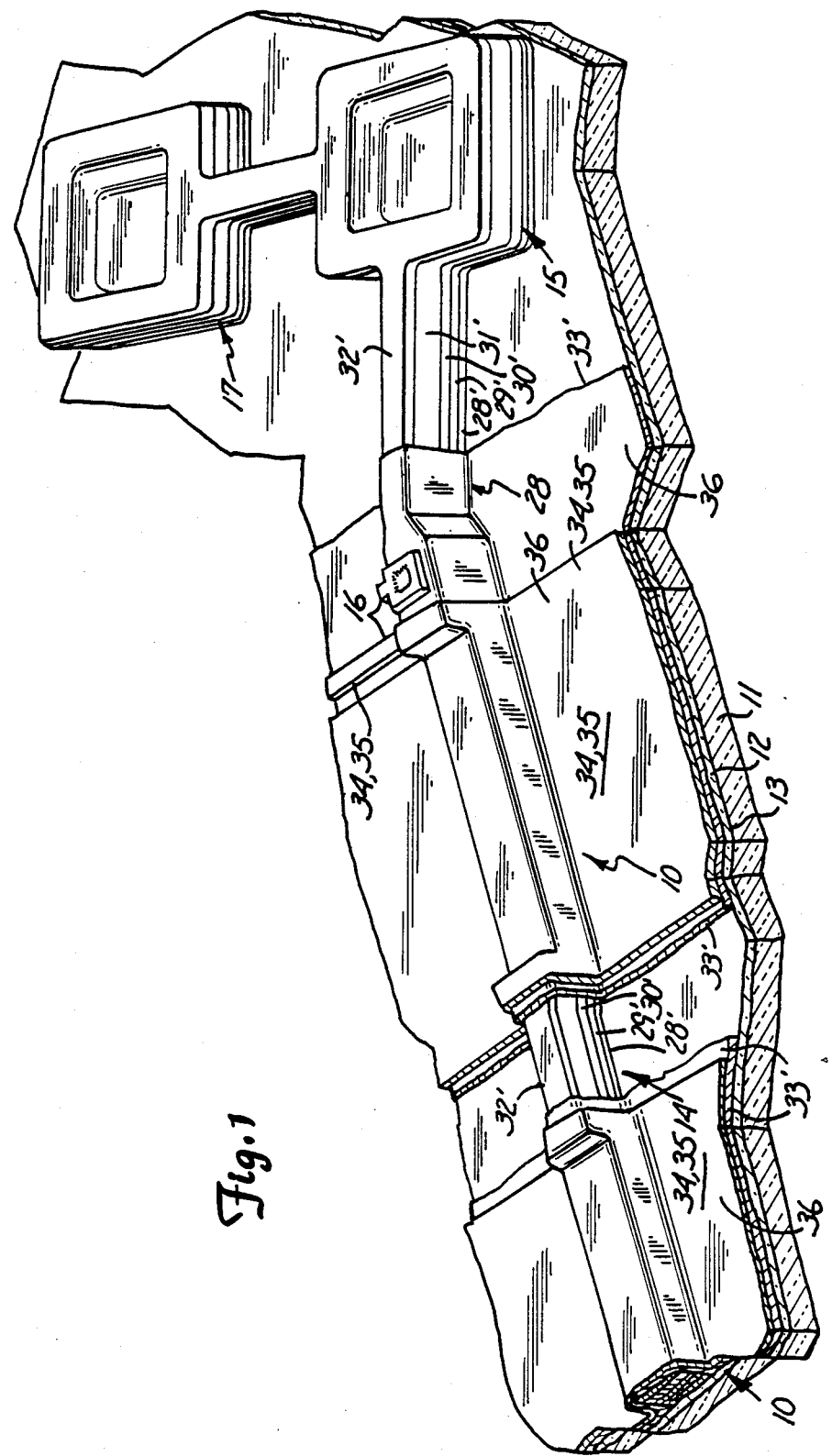
FIG. 1 shows a portion of the monolithic integrated circuit embodying the present invention.

A portion of a monolithic integrated circuit, including part of a magnetic material memory cell array as a part of a digital memory therein, is shown in FIG. 1. Each memory cell shown is formed as a bit structure, 10, including appropriate magnetic material. Bit structures 10 are formed over a semiconductor material body, 11, and directly on an insulating layer, 12, supported on a major surface, 13, of body 11. Only a small portion of the integrated circuit is shown as there would be a large number of bit structures in a complete memory, and then only a small portion of the semiconductor material body is shown of that integrated circuit portion. The structures shown are not drawn to correct scale, nor are they necessarily in correct proportion, in the interest of clarity.

Between the two bit structures 10 shown in FIG. 1 is a juncture portion, 14. A narrowing of the layers shown approaching juncture 14 reduces the demagnetization fields in bit structures 10. Provision of a layer of conductive material at a juncture 14 between a pair of bit structures 10 obviates magnetic effects in the magnetic material continued through that juncture 14 from one bit structure 10 to the next by shunting currents around the magnetic material.

On the right of the right-hand bit structure 10 is an extended portion of the structure which serves to provide an interconnection to integrated circuit structures below the surface of insulating layer 12 through the contact, 15. Provision of conductive material on the extended portion, and on contact 15, again serves to obviate any magnetic effects because of the magnetic material contained therein.

Thus, the structural portion shown in FIG. 1, primarily on the surface of insulating layer 12, comprises bit structures 10, juncture 14, and an extension therefrom to contact 15 for electrically contacting structures below the surface of layer 12. This arrangement provides both magnetic memory cell structures and circuit component interconnection structures.

Further metallization structures formed simultaneously with the structure shown in FIG. 1, primarily on the surface of layer 12, and which serve to interconnect other circuit components in the monolithic integrated circuit, can together serve as a first metallization layer of electrical interconnections in a multiple layer interconnection arrangement. A second layer of metallization, separated by an insulator from such a first layer except where there are openings in this insulator to permit interconnections between the two levels of interconnections, can be further provided to give added flexibility in making circuit interconnections. A portion, 16, of such a second level of metallization is shown in FIG. 1 making electrical contact to a first metallization layer through an insulating layer and between a bit structure 10 and contact 15.

A further contact structure, 17, extending through insulating layer 12 to electrically connect to structures below the surface thereof, is shown in FIG. 1. Contact 17 is further shown connected to contact 15 through the first level metallization portion of the interconnection network. As a result, the circuit structure below the surface of layer 12 connected by contact 15 is directly electrically connected to the component structure contacted below the surface of insulator 12 by contact 17.

FIGS. 2A through 2E show in cross section views the structure resulting from fabrication steps which together lead to the fabrication of the first level metallization structure shown in FIG. 1 primarily located on the surface of insulator 12. The cross section view shown in FIGS. 2A through 2E are of the structure shown in FIG. 1, but the right side of these views present two alternative fragments of the cross section of the location of contact 15 showing alternative structures. Again, these figures are not to scale and not necessarily in proportion for the purposes of improving clarity.

Figure 2A:
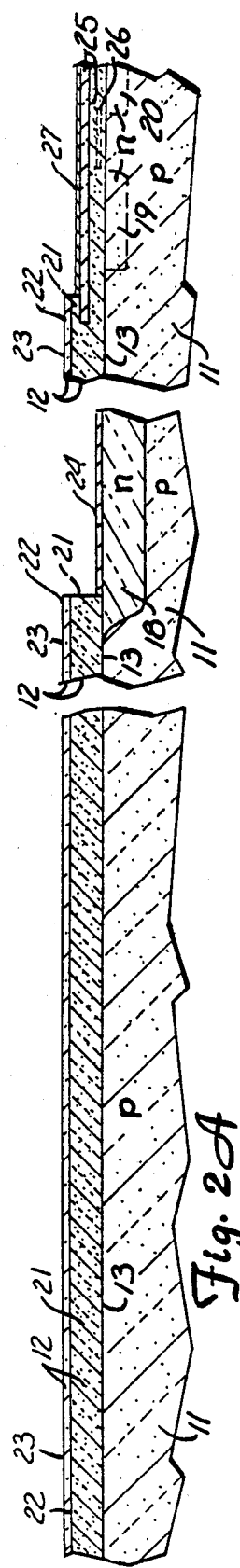
FIGS. 2A through 2E show in cross section view the results of fabrication steps used in fabricating a monolithic integrated circuit embodying the present invention.
Figure 2B:
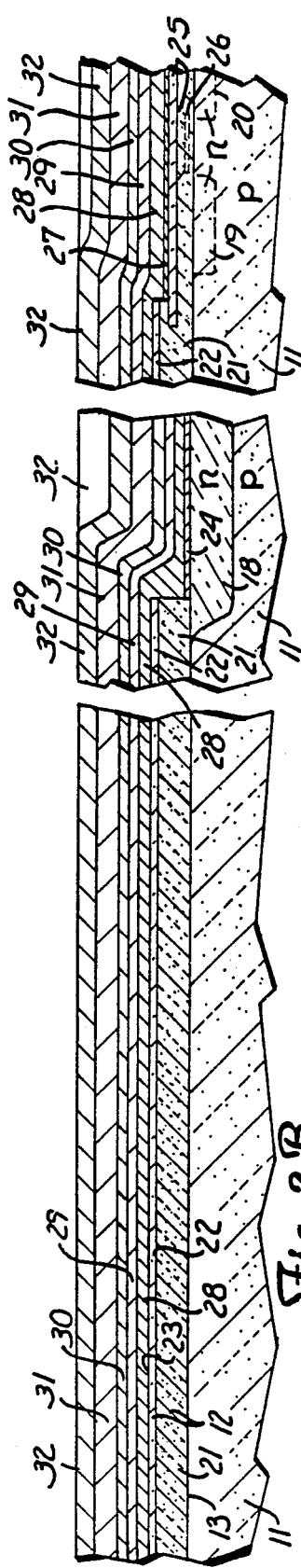

Shown in FIG. 2A is semiconductor material body 11, typically of doped silicon where the dopant is chosen to yield the conductivity type desired for forming the transistors and other structures used in other portions of the monolithic integrated circuit, these types being either p- or n-type conductivity. The conductivity shown for semiconductor body 11 in FIG. 2A is designated to be p-type conductivity though in some circumstances it would be chosen to be n-type conductivity.

The contact 15 alternative fragmentary cross section view pairs in FIG. 2A each shows one or more portions of semiconductor body 11 intersecting surface 13 having an opposite conductivity type. That is, there is a n-type conductivity region, 18, shown in the left one of the fragmentary cross section view pair, and there are two n-type conductivity regions, 19 and 20, shown in semiconductor material body 11 in the right one of the fragmentary cross section view pair. Region 18 might be the cathode of a diode, the emitter of a npn bipolar transistor, or the base of a pnp bipolar transistor. Again, conductivity types could be interchanged between the regions to result in complementary devices or regions. Regions 19 and 20 are shown as the terminating regions serving as the source and drain of a n-channel metal-oxide-semiconductor field-effect transistor (MOSFET).

On major surface 13 of semiconductor body 11 is formed insulating layer 12, as previously indicated. Insulating layer 12 is formed as a composite structure shown as two layers. A first layer, 21, is formed of oxides of silicon and comprises primarily silicon dioxide. The thickness chosen for this layer will depend on several factors pertinent to the monolithic integrated circuit formed therebelow. A further layer, 22, of silicon nitride is formed on the upper surface of oxide layer 21. Silicon nitride layer 22 is formed by sputter deposition using a silicon target in an argon and nitrogen atmosphere, and using the usual 13.56 MHz frequency for such sputtering. Layer 22 will have a thickness of approximately 200 Å. This layer serves as a diffusion barrier to keep oxygen atoms in oxide layer 21 from diffusing upward into the structures to be formed above layer 22.

Openings are shown formed in insulating layer 12 in each of the contact 15 fragmentary cross section view pair members to the right in FIG. 2A. These openings accommodate having contact 15 in electrical contact through layer 12 to circuit components provided below the major surface, 23, of layer 12. In the fragmentary view containing region 18, layer 12 has been opened all the way through from surface 23 to surface 13 of semiconductor material 11. In that opening, there has been provided a palladium silicide layer, 24, on the surface of region 18. Such a layer is well known for assuring good electrical contact between the metallization interconnection system and the semiconductor structure therebelow while avoiding damage to such semiconductor structure due to "spiking" of the metallization.

The fragmentary view containing the MOSFET in FIG. 2A has the opening in layer 12 extending down to only a doped polysilicon layer, 25, which, at a location further in, dips down to form the gate, 26, of the MOSFET. In the opening in layer 12 exposing doped polysilicon layer 25 there has again been provided a palladium silicide layer, 27, for the purpose again of assuring good electrical contact. Either of these palladium silicide layers can be formed by sputter depositing palladium to a thickness of 500 Å and then annealing the structure at 300° C. for 30 minutes to yield 1000 Å of palladium silicide.

After the monolithic integrated circuit structure with its transistor circuitry has been prepared to the extent shown in FIG. 2A, the first level of metallization containing the magnetic memory cell structures and the circuit interconnection structures can then be formed using this structure of FIG. 2A as a base. This is accomplished by providing a series of layers through a corresponding series of deposition steps to result in these layers being disposed over either the exposed surfaces of the structure of FIG. 2A, or on the exposed surface of a preceding layer already deposited. The first of these layers is a magnetic material layer, 28, shown in FIG. 2B.

The metallic thin film of layer 28 is an alloy of nickel, cobalt and iron. Typically, the proportions are chosen to strongly reduce or eliminate any magnetostrictive effects in the film, and to improve certain other properties of film for the application. As one example, the film material might comprise approximately 65% nickel, 15% iron, and 20% cobalt. In some situations, other materials are added to the alloy in relatively small amounts to improve certain properties of the film.

Such a film can be fabricated by sputter deposition using, as a target, an alloy having these proportions in argon gas. This deposition is continued until typically 150 Å of the alloy have been deposited. Further, the deposition is done in the presence of an external magnetic field oriented in a selected direction so that the resulting magnetic thin film will exhibit uniaxial anisotropy with the easy axis thereof parallel to the external magnetic field orientation. The magnetization vector of the film will lie in the plane of the film because any other result would lead to large demagnetizing fields in the film.

The magnetization, in minimizing the magnetic energy in accord with thermodynamics, will lie along the easy axis of the film pointing in one direction or another along that axis in the absence of externally applied magnetic fields. As long as the magnetization of the film portion in a memory cell is in a single domain state, this magnetization vector can be caused to rotate with respect to the easy axis to angles determined by externally applied fields, and this can be made to occur without substantially affecting the magnitude of this magnetization. The magnetization vector can be made to switch from one direction along the easy axis to the opposite direction, the result being that the magnetization vector can be in one of two different states to provide the basis for storing a binary bit.

Such a ferromagnetic thin film further exhibits magnetoresistance. Differences in direction between that of the magnetization vector in the thin film and that of the current path through the thin film leads to differences in the effective electrical resistance in the direction of the current. The maximum resistance occurs if the magnetization vector in the film and the current direction are parallel, while the minimum occurs if they are perpendicular.

Thus, external magnetic fields can be used to vary the angle of the magnetization vector in memory cell thin film portions with respect to the easy axis of these portions, and can vary to such an extent as to cause switching of the magnetization vector between two stable states which occur as magnetizations in opposite directions along the easy axis. Further, the state of the magnetization vector in such a film portion can be measured or sensed by the change in resistance encountered by a current directed through a thin film portion. This provides a basis for a film portion to serve as a bit storage means in a memory cell, the state of which is subject to being determined by effects occurring in currents being applied to or about a thin film portion.

However, because of the effect of one bit structure or memory cell on a neighboring one, and vice versa, a single thin film portion has been found to be unsatisfactory for use in memory cells. An arrangement permitting the magnetic field in the memory cell to be more closely confined thereto makes use of a further magnetic film in the memory cell lying parallel to the first but separated therefrom by a non-magnetic material layer. Thus, a layer, 29, of tantalum doped with nitrogen is sputter deposited on layer 28. This layer is sputter deposited by use of a tantalum target in a nitrogen gas, and continues until a layer of approximately 50 Å is deposited. This nitrogen doped tantalum layer has no significant magnetic properties but is electrically conductive, having a significant resistance between separated points on a common surface thereof but relatively little resistance across its thickness because of its being so thin. Thereafter, a further magnetic material layer, 30, is sputter deposited on the exposed surface of layer 29 using the same method and materials as were used in providing layer 28 to reach approximately the same thickness.

The resulting "sandwich" structure of two layers 28 and 30 of magnetic materials separated by layer 29 of non-magnetic material is effective in reducing magnetic fields outside the bit structures which will be later formed from these layers for each memory cell because the magnetic fields occurring in either of the ferromagnetic thin film layers 28 and 30 are, to a considerable extent, confined to the magnetic path one provides for the other. Thus, the effect of magnetic fields occurring in either of layers 28 or 30 in a bit structure will be much reduced insofar as interfering with a neighboring bit structure. Layer 29, between layers 28 and 30, is used to prevent the exchange interaction, which can occur between electron spins on neighboring atoms, from being coupled across between layers 28 and 30 to lock together the magnetization vectors in each.

This sandwich structure of layers 28, 29 and 30 has next deposited thereon a further layer, 31, of nitrogen doped tantalum which protects the sandwich structure during subsequent processing steps and prevents a later applied layer of silicon dioxide being a source of oxygen atoms to diffuse into and degrade alloy layer 30. The resistivity and the geometrical arrangement of nitrogen doped tantalum layers 29 and 31 are such that currents supplied longitudinally parallel to the major layer surfaces will flow primarily in ferromagnetic alloy material layers 28 and 30. As a result, the setting of the magnetization vectors in bit structures to be formed in these layers, and the sensing of the direction of the magnetization through magnetoresistive changes therein, can be accomplished in these layers to the extent required by currents passing therethrough.

Finally, a layer, 32, of tungsten is sputter deposited in argon gas to a thickness in the vicinity of 5000 Å. This tungsten layer serves as a "backbone" for the resulting interconnection paths to be formed through providing a sufficiently thick conductor arrangement to assure that continuous conductor paths can be formed over edges occurring in the surface of insulating layer 12 because of the various structures formed therebelow in connection with the monolithic integrated circuit transistor circuitry. Further, this tungsten layer reduces the resistance of the interconnection portions of the structure shown in FIG. 1 on the surface of insulating layer 12. The completion of the depositions of these layers results in the structure shown in FIG. 2B.

Figure 2C:
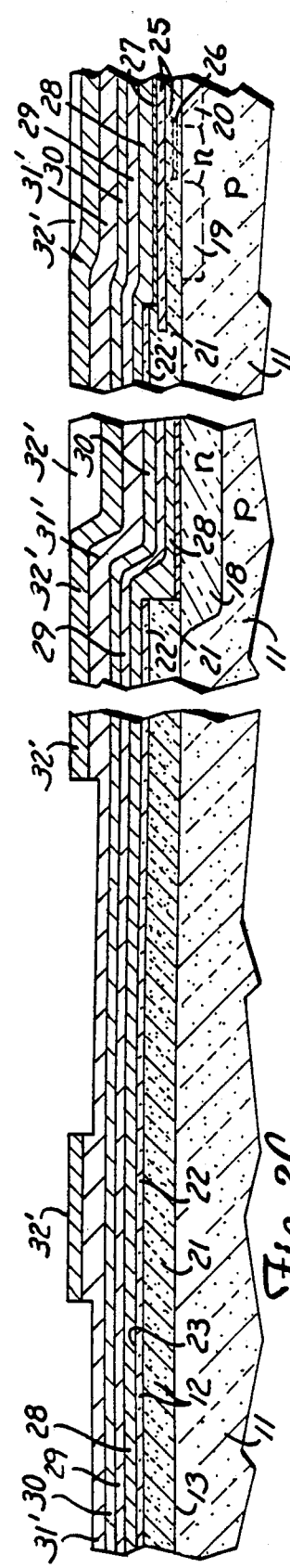

These deposited layers must then have selected portions thereof removed to result in a first level of metal interconnections and the magnetic memory cell structures integrated therewith, an example being the portion thereof shown in FIG. 1 primarily on the surface of insulating layer 12. The first step in this removal process is to provide photoresist in a standard photoresist application and patterning process on tungsten layer 32 with openings therein at every location in which a magnetic memory cell bit structure is to be formed. Upon completion of such a photoresist layer, the structure is placed in a plasma etcher to use reactive ion etching to remove tungsten layer 32 where exposed under this photoresist. This removal is accomplished using a mixture of reactive gasses comprising 43% of nitrogen trifluoride ($NF_3$), 43%, of trifluoromethane ($CHF_3$), and 14% of oxygen gas ($O_2$). The result is shown in FIG. 2C where the etched tungsten layer has been redesignated 32′ and the partly etched nitrogen doped tantalum layer has been redesignated 31′.

Thereafter the photoresist is stripped away in a standard procedure. Then a layer of quartz, i.e. silicon dioxide, is sputter deposited on the exposed surfaces using a RF bias of 30 to 50 volts at the same frequency as the RF used in the sputter depositioning process. This is accomplished by using a quartz target in the deposition chamber. The bias results in a tendency to fill in low spots to thereby reduce bumpiness and provide a more nearly planar resulting surface. This silicon dioxide layer sputter deposition is continued until a layer of approximately 5000 Å thickness results.

Using again a standard photoresist process, photoresist is provided on this quartz surface covering those portions below which a conductor in the first metallization or a magnetic material memory cell is to be provided, i.e. following the pattern desired for first level metallization including the interconnection portions and the magnetic material memory cell portions. This arrangement is then submitted to reactive ion etching in a plasma etcher where the etching gas comprises 75% of trifluoromethane ($CHF_3$) and 25% of oxygen ($O_2$) to remove the exposed portions of the quartz layer just provided. The photoresist is then stripped away leaving the quartz or silicon dioxide only over the desired first metallization structures including interconnections and magnetic memory cells. Elsewhere, other portions of tungsten layer 32′ have been exposed.

The exposed portions of tungsten layer 32′ are then also submitted to reactive ion etching in a plasma etcher using the same etching gas indicated above. The silicon dioxide portions protect the structures therebelow during this etching from being etched significantly. Thus, the exposed tungsten is completely removed.

This structure is then exposed to an ion milling process using argon gas as the milling agent. The oxide continues to protect the structures therebelow but the other portion exposed of the layers 28, 29, 30 and 31 which have been deposited on surface 23 of insulating layer 12 are removed down to surface 23 leaving the first metallization structures although not yet complete. All of the layer portions remaining will now be referred to with their numbers having a prime mark placed thereafter to indicate they are the remaining portions of the original layers designated by those numbers.

As can be seen in FIG. 1, the magnetic material memory cells comprising bit structures 10 are somewhat widened compared to those other portions of the first metallization example portion shown in this figure, these other portions serving as interconnection conductor portions. The widened structures of bit structures 10 taper at the ends to meet the thinner interconnection portions. Such tapering and narrowing of bit structures 10 at the ends thereof reduces the demagnetizing fields in bit structures 10 as has been described in the related application to J. Daughton and J. Huang referred to above.

Figure 2D:
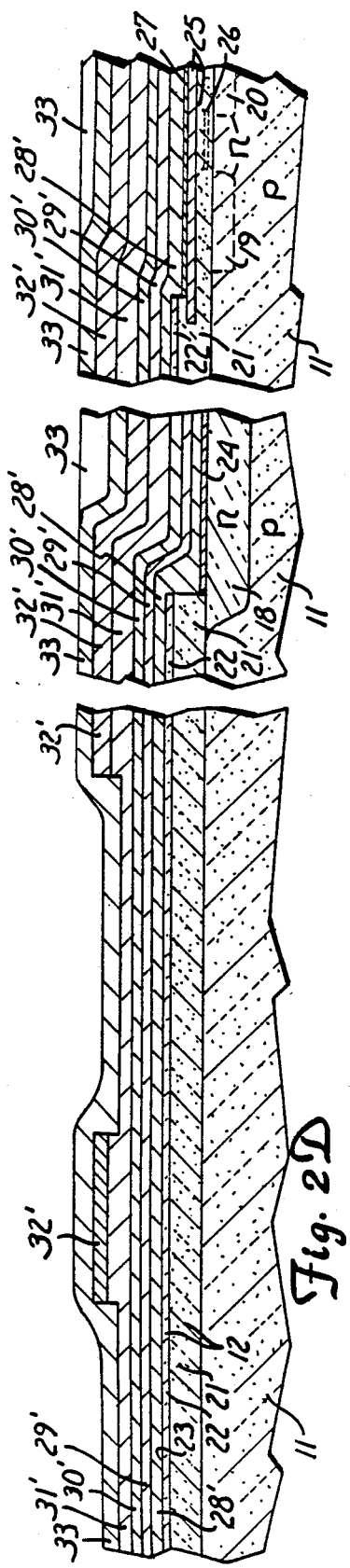

At this point, the remaining portions of the last provided silicon dioxide layer are removed and a new layer, 33, of silicon dioxide is provided using a quartz target in a sputter deposition with again an RF voltage bias on the substrate. This deposition is continued until layer 33 reaches a thickness of about 8000 Å. The result is shown in FIG. 2D.

Next, photoresist using a standard method is again applied on the surface of layer 33 leaving openings in the photoresist where openings are to be provided in layer 33 to permit second level metallization contacts to be made to the first level metallization. This structure is submitted to reactive ion etching in a plasma etcher to provide such openings in layer 33 in the same manner as was done above in removing portions of the previously provided silicon dioxide layer. The photoresist is then removed using a standard method. The layer is redesignated layer 33'.

Providing these openings is followed by sputter depositing a layer of titanium and tungsten in a sputter deposition using a composite target of titanium and tungsten. This layer is provided in a thickness of around 1200 Å. Thereafter, a layer of aluminum alloyed with about 2% copper is sputter deposited on the layer of tungsten using a corresponding aluminum-copper alloy target, the thickness of this aluminum layer being about 10,000 Å.

Photoresist in a standard manner is applied over the layer of aluminum in a pattern desired for the second level metallization interconnections and for the word line structures used in connection with operating the magnetic material memory cell bit structures. These word line structures are used in carrying current to provide magnetic fields in the magnetic material layers 28 and 30 to set the direction of the magnetization therein as part of the storing and retrieving of information from these magnetic material memory cells.

Figure 2E:
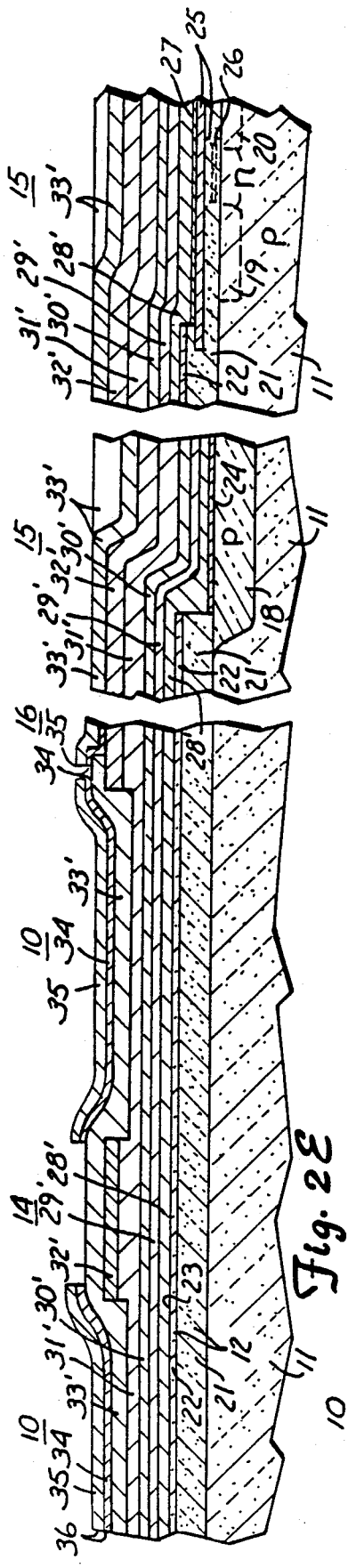

This structure is then subjected to reactive ion etching in a plasma etcher using an etching gas comprising chlorine gas ($Cl_2$) mixed with boron trichloride ($BCl_3$) where the chlorine gas is 21% of the mixture. The results are shown in FIG. 2E where the titanium-tungsten base layer, used to prevent diffusion and to provide good adhesion, is designated 34, and the copper alloyed aluminum layer used to provide low resistance is designated 35. The word line structures are designated 36. Also shown in FIG. 2E are designations for bit structures 10, juncture 14 between these bit structures, and second metallization level interconnection 16.

Word lines 36 are shown provided of a sufficient width to cover each bit structure 10 and to overlap onto the adjacent conductive portions of the first level of metallization system under remaining tungsten layer portions 32'. Such wide word lines provide improved operation insofar as assuring the ability to switch the magnetization in bit structure 10. The wide word lines assure a magnetic field being provided significantly over all of each bit structure 10. This is thought to aid switching because of the possibility of a domain wall becoming attached at a defect in the magnetic material in a bit structure 10 which wall becomes difficult to move away from the defect when under the influence of a subsequently supplied, but marginal, magnetic field directing it to do so. Such a field can be marginal because of being a substantial distance away from the current generating it which can happen if narrow word lines are used in view of limits on the currents which can be used. The provision of a word line covering the entire bit structure assures that a significant magnetic field is present everywhere therein to cause switching.

The presence of wide word lines 36 also assures that the region of the magnetic material affected in the switching occurs out into the tapered region, a situation which tends to force domain walls further into the narrow neck region at the adjacent bit juncture 14 because the minimum magnetic energy state is achieved by shortening the domain wall to the extent possible. Thus, this also tends to assure that the domain wall does not deform back into the bulk portion of a bit structure 10. Thus, the application of a sense current through a bit structure 10 and a word current in the overlapping word line causes a wall to be moved into the taper and, as a result, a little way into the juncture. This results in the bit magnetization being stably established. Such a stably established bit is less susceptible to disturbances such as those which occur if the sense current in the bit structure is reversed during a reading operation, or if adjacent bit structures have the magnetization state therein changed.

In any event, as can be seen in FIG. 2E, in those locations where the remaining tungsten layer portions 32' are retained there is no effective magnetic memory cell because the tungsten provides a current conduction path in the first level metallization portion shown to short circuit the current around layers 28 and 30 in those locations. These, instead, are conductive interconnection regions. Further, placement of word lines over first metallization structures occurs essentially just where bit structures are present so that there is little of remaining tungsten portion 32' thereunder. Thus, most of the current in a word line is carried in locations that are relatively far from those places where such tungsten portions occur and so generates a smaller magnetic field there. Hence, the primary magnetic effect of currents on these word lines will be at bit structures 10 and not where tungsten portions 32' are provided to form interconnection portions between bit structures 10, or between bit structures 10 and the circuitry in the integrated circuit below insulating layer 12. As a result, a single composite metallization can be used to form all of the magnetic material memory cells and all of the conductive interconnections in the first layer of metallization. This avoids using a second metal system with the memory cell bit structure composite metallization system to complete interconnections from bit structures 10 to circuit portions in the monolithic integrated circuit below insulating layer 12.

Because of the tolerances that must be allowed in using a metal system portion of a second kind to complete first level metallization, there is a reduction in the compactness of the resulting first level metallization which can be avoided by using a single composite metallization structure for the first level metallization as shown in FIGS. 1 and 2A through 2E. In addition, an additional masking step is eliminated to thereby increase reliability and reduce cost.

Figure 3:
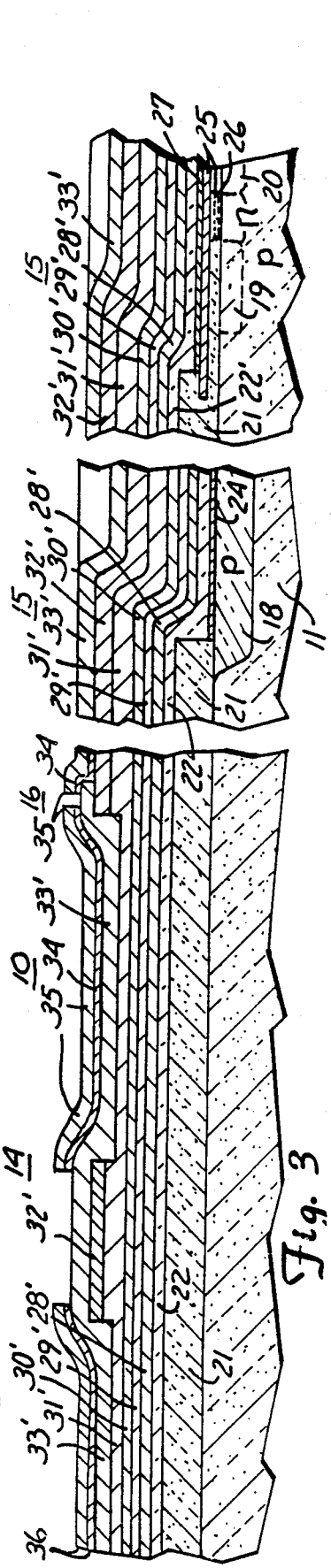
FIG. 3 shows in cross section view the results of the fabrication steps used in fabricating a monolithic integrated circuit having a structure alternative to that resulting from the steps used in FIGS. 2A through 2E.

FIG. 3 shows approximately the same structure shown in FIG. 2 but with the use of a different initial diffusion barrier layer. That is, rather than using silicon nitride layer 22 as shown in FIGS. 2A through 2E, a layer of nitrogen doped tantalum is used as a diffusion barrier. The difference is that this layer is continued through the openings in silicon dioxide layer 21 in both of the fragmentary cross section views shown to the right in FIG. 3 so that this nitrogen doped tantalum layer, now designated 22', is now in contact with palladium silicide layers 24 or 27.

Although the present invention has been described with reference to preferred embodiments, workers skilled in the art will recognize that changes may be made in form and detail without departing from the spirit and scope of the invention.

What is claimed is:

1. A composite metallization interconnection system used on and at least partly through an electrical insulating layer having openings therein which layer is supported on a major surface of a semiconductor material substrate in a monolithic integrated circuit, said composite metallization interconnection system providing both electrical interconnections between circuit components in said integrated circuit and magnetic interaction regions capable of having a current established therethrough so as to result in a magnetoresistive response therein, said composite metallization interconnection system comprising:

a first selected region in said semiconductor material substrate intersecting said major surface thereof of a selected conductivity type, said first selected region occurring at a first one of said openings in said insulating layer which extends from said major surface at said first selected region through said insulating layer to an outer surface thereof; and a first composite structure portion electrically connected to said first selected region and extending through said first opening to be supported on said outer surface of said insulating layer and include a first one of said magnetic interaction regions, said first composite structure portion comprising (i) a first magnetic structure having an intermediate layer of a separating material which has first and second major surfaces on opposite sides thereof with there being on each a thin film of magnetoresistive, anisotropic ferromagnetic material, and with said first magnetic structure being supported at said thin film on said intermediate layer first surface by said insulating layer, said first magnetic interaction region being present at a selected location in said thin film, and (ii) a first conductive structure of an electrical conductivity substantially greater than that of said first magnetic structure, said first conductive structure being supported at a side thereof by said thin film on said intermediate layer second major surface except at said first magnetic interaction region at which said first conductive structure is absent.

2. The apparatus of claim 1 wherein said first selected region is surrounded at said major surface by portions of said semiconductor material substrate which are of an opposite conductivity type.

3. The apparatus of claim 2 wherein said first selected region is part of a transistor structure.

4. The apparatus of claim 1 wherein said composite metallization interconnection system further comprises second and third selected regions in said semiconductor material substrate each intersecting said major surface thereof and each of a selected conductivity type, said second and third selected regions occurring at corresponding second and third ones of said openings in said insulating layer each of which extends from said major surface at its corresponding one of said second and third selected regions through said insulating layer to said outer surface thereof, and further comprises a second composite structure electrically connected to said second selected region and extending through said second opening portion to be supported on said outer surface of said insulating layer and be electrically connected to said third selected region through said third opening, said second composite structure portion comprising (i) a second magnetic structure having an intermediate layer of another separating material which has first and second major surfaces on opposite sides thereof with there being on each another thin film of magnetoresistive, anisotropic ferromagnetic material, and with said second magnetic structure being supported at this other said thin film on said intermediate layer first surface by said insulating layer, and (ii) a second conductive structure of an electrical conductivity substantially greater than that of said second magnetic structure, said second conductive structure being supported at a side thereof by said thin film on said second magnetic structure intermediate layer second major surface.

5. The apparatus of claim 4 wherein said second and third selected regions are each surrounded at said major surface by portions of said semiconductor material substrate which are of an opposite conductivity type.

6. The apparatus of claim 1 wherein said first composite structure portion comprises a plurality of magnetic interaction regions including said first magnetic interaction region located in said first magnetic structure and at each of which said first conductive structure is absent.

7. The apparatus of claim 6 having an electrically insulative separating layer adjacent each member of said plurality of magnetic interaction regions on which is supported a portion of a second conductive structure which extends across its corresponding magnetic interaction region to across from portions of said first conductive structure on either side of that magnetic interaction region.

8. The apparatus of claim 1 wherein a resistive protective layer separates said first conductive structure from said first magnetic structure.

9. The apparatus of claim 7 wherein at least a portion of said resistive protective layer is also over said first magnetic interaction region.

10. The apparatus of claim 1 wherein a diffusion barrier layer separates said first magnetic structure from said outer surface of said insulating layer.

11. The apparatus of claim 10 wherein said thin film is in direct mechanical contact with said first selected region.

12. The apparatus of claim 10 wherein said diffusion barrier layer is also a resistive layer, and also separates said thin film from said first selected region through being in direct mechanical contact with said first selected region.

13. A composite metallization interconnection system used on and at least partly through an electrical insulating layer having openings therein which layer covers conductors formed adjacent a major surface of a semiconductor material substrate in a monolithic integrated circuit, said composite metallization interconnection system providing both electrical connections between circuit components in said integrated circuit and magnetic interaction centers capable of having a current established therethrough so as to result in a magnetoresistive response therein, said composite metallization interconnection system comprising:

a first selected conductor from those said conductors, said first selected conductor occurring at a first one of said openings in said insulating layer which extends from said first selected conductor through said insulating layer to an outer surface thereof; and a first composite structure portion electrically connected to said first selected conductor and extending through said first opening to be supported on said outer surface of said insulating layer to include a first one of said magnetic interaction regions, said first composite structure portion comprising (i) a first magnetic structure having an intermediate layer of a separating material which has first and second major surfaces on opposite sides thereof with there being on each a thin film of magnetoresistive anisotropic ferromagnetic material, and with said first magnetic structure being supported at said thin film at said intermediate layer first surface by said insulating layer, said first magnetic interaction region being present at a selected location in said thin film, and (ii) a first conductive structure of an electrical conductivity substantially greater than that of said first magnetic structure, said first conductive structure being supported at a side thereof by said thin film on said intermediate layer second major surface except at said first magnetic interaction region at which said first conductive structure is absent.

14. The apparatus of claim 13 wherein said first selected conductor is a gate conductor of an insulated gate field-effect transistor.

15. The apparatus of claim 13 wherein said composite metallization interconnection system further comprises first and second selected regions in said semiconductor material substrate each intersecting said major surface thereof and each of a selected conductivity type, said first and second selected regions occurring at corresponding second and third ones of said openings in said insulating layer each of which extends from said major surface at its corresponding one of said first and second selected regions through said insulating layer to said outer surface thereof, and further comprises a second composite structure portion electrically connected to said first selected region through said second opening and from there extending over and supported on said outer surface of said insulating layer to be electrically connected to said second selected region through said third opening, said second composite structure portion comprising (i) a second magnetic structure having an intermediate layer of another separating material which has first and second major surfaces on opposite sides thereof with there being on each another thin film of magnetoresistive, anisotropic ferromagnetic material, and with said second magnetic structure being supported at this other said thin film on said intermediate layer first surface by said insulating layer, and (ii) a second conductive structure of an electrical conductivity substantially greater than that of said second magnetic structure, said second conductive structure being supported at a side thereof by said thin film on said second magnetic structure intermediate layer second major surface.

16. The apparatus of claim 15 wherein said first and second selected regions are each surrounded at said major surface by portions of said semiconductor material substrate which are of an opposite conductivity type.

17. The apparatus of claim 13 wherein said composite metallization interconnection system further comprises a second selected conductor from those said conductors which occur at a second one of said openings in said insulating layer which extends from said conductor through said insulating layer to an outer surface thereof, and a first selected region in said semiconductor material substrate intersecting said major surface thereof and of a selected conductivity type which occurs at a third selected one of said openings in said insulating layer and extends from said major surface at its corresponding said first selected region through said insulating layer to said outer surface thereof, and further comprises a second composite structure portion electrically connected to said second conductor through said second opening and from there extended over and supported on said outer surface of said insulating layer to be electrically connected to said first selected region through said third opening, said second composite structure portion comprising (i) a second magnetic structure having an intermediate layer of another separating material which has first and second major surfaces on opposite sides thereof with there being on each another thin film of magnetoresistive, anisotropic ferromagnetic material, and with said second magnetic structure being supported at this other said thin film on said intermediate layer first surface by said insulating layer, and (ii) a second conductive structure of an electrical conductivity substantially greater than that of said second magnetic structure, said second conductive structure being supported at a side thereof by said thin film on said second magnetic structure intermediate layer second major surface.

18. The apparatus of claim 13 wherein said first composite structure portion comprises a plurality of magnetic interaction regions including said first magnetic interaction region located in said first magnetic structure and at each of which said first conductive structure is absent.

19. The apparatus of claim 18 having an electrically insulative separating layer adjacent each member of said plurality of magnetic interaction regions on which is supported a portion of a second conductive structure which extends across its corresponding magnetic interaction region to across from portions of said first conductive structure on either side of that magnetic interaction region.

20. The apparatus of claim 13 wherein a resistive protective layer separates said first conductive structure from said first magnetic structure.

21. The apparatus of claim 20 wherein at least a portion of said resistive protective layer is also over said first magnetic interaction region.

22. The apparatus of claim 13 wherein a diffusion barrier layer separates said first magnetic structure from said outer surface of said insulating layer.

23. The apparatus of claim 22 wherein said thin film is in direct mechanical contact with said first selected conductor.

24. The apparatus of claim 22 wherein said diffusion barrier layer is also a resistive layer, and also separates said thin film from said first selected region through being in direct mechanical contact with said first selected region.

25. A method of fabricating a composite metallization interconnection system on and at least partly through an electrical insulating layer supported on a major surface of a semiconductor material substrate in a monolithic integrated circuit, said composite metallization interconnection system providing both electrical interconnections between circuit components and said integrated circuit and magnetic interaction regions capable of having a current established therethrough so as to result in a magnetoresistive response therein, said method comprising:

providing a plurality of openings in said insulating layer from an outer surface thereof including a first opening from said outer surface to said major surface at a first selected region of a selected conductivity type in said semiconductor material substrate intersecting said major surface;

forming a magnetic structure on said outer surface of said insulating layer and on said first selected region, said magnetic structure comprising an intermediate layer of a separating material which has first and second major surfaces on opposite sides thereof with there being on each a thin film of magnetoresistive, anisotropic ferromagnetic material;

forming a conductive structure on said magnetic structure with said conductive structure having an electrical conductivity substantially greater than that of said magnetic structure; and removing selected portions of said conductive structure from locations in said magnetic structure selected to have said magnetic interactive regions.

26. The method of claim 25 wherein said providing of said magnetic structure is accomplished by providing a diffusion barrier layer on said outer major surface, providing a first layer of said magnetoresistive, anisotropic ferromagnetic material, providing said intermediate layer, and providing a second layer of said magnetoresistive, anisotropic ferromagnetic material.

27. The method of claim 26 wherein said providing of said magnetic layer is accomplished by providing said diffusion barrier layer, first layer of magnetoresistive, anisotropic ferromagnetic material, said intermediate layer, and said second layer of magnetoresistive, anisotropic ferromagnetic material on said first selected region.

28. The method of claim 26 wherein said providing of said magnetic structure is accomplished by providing said first layer of magnetoresistive, anisotropic ferromagnetic material, said intermediate layer, and said second magnetoresistive, anisotropic ferromagnetic material on said first selected region.

29. The method of claim 25 wherein said providing of said conductive structure comprises providing a resistive protective layer on said magnetic structure, and providing a conductive layer on said resistive protective layer.

30. The method of claim 27 wherein said removing of portions of said conductive structure is accomplished by removing portions of said conductive layer.

31. The method of claim 30 wherein said removing of portions of said conductive structure is accomplished by also removing a part of said resistive protective layer beneath those said removed portions of said conductive layer.

32. The method of claim 25 wherein said insulating layer covers conductors adjacent said major surface and a second opening is provided in said insulating layer from said outer major surface to a first one of said conductors, said magnetic structure also being formed on said first conductor.

33. The method of claim 31 wherein said providing of said magnetic layer is accomplished by providing said diffusion barrier layer, first layer of magnetoresistive, anisotropic ferromagnetic material, said intermediate layer, and said second layer of magnetoresistive, anisotropic ferromagnetic material on said first selected region and on said first conductor.

34. The method of claim 31 wherein said providing of said magnetic structure is accomplished by providing said first layer of magnetoresistive, anisotropic ferromagnetic material, said intermediate layer, and said second magnetoresistive, anisotropic ferromagnetic material on said first selected region and on said first conductor.

\* \* \* \* \*